United States Patent [19]
Zajac

[11] 4,307,283
[45] Dec. 22, 1981

[54] PLASMA ETCHING APPARATUS II-CONICAL-SHAPED PROJECTION

[75] Inventor: John Zajac, San Jose, Calif.

[73] Assignee: Eaton Corporation, Cleveland, Ohio

[21] Appl. No.: 79,523

[22] Filed: Sep. 27, 1979

[51] Int. Cl.³ .............................................. B23K 9/00
[52] U.S. Cl. ...................... 219/121 PG; 219/121 PE; 219/121 PF; 204/192 E; 156/643; 156/345; 250/531; 250/534; 250/539
[58] Field of Search .................. 219/121 PF, 121 ET, 219/121 PG; 204/192 R, 192 E, 298, 164; 313/231.3, 231.4; 156/643, 345; 250/531, 535, 534, 539

[56] References Cited

U.S. PATENT DOCUMENTS

| | | | |
|---|---|---|---|
| 3,572,875 | 3/1971 | Noble | 250/531 X |
| 3,664,942 | 5/1972 | Havas et al. | 204/192 E |
| 3,816,196 | 6/1974 | La Combe | 156/643 |
| 3,859,535 | 1/1975 | Bartz | 250/531 |
| 3,879,597 | 4/1975 | Bersin et al. | 204/192 E |
| 4,017,404 | 4/1977 | Habeger | 250/531 |
| 4,033,287 | 7/1977 | Alexander, Jr. et al. | 204/298 |
| 4,134,817 | 1/1979 | Bourdon | 204/192 E |
| 4,148,705 | 4/1979 | Battey et al. | 156/643 |

FOREIGN PATENT DOCUMENTS 52-22335  6/1977  Japan ............................. 204/192 R

OTHER PUBLICATIONS

"Device Etching for Microscope Sample Preparation", IBM Disclosure, vol. 15, No. 2, Jul. 1972, 156-345 by Deines.

"Achieving Uniform Etch Rates in Reactive Ion Plasma Etching Processes", by Gartner et al., IBM Disclosure, vol. 20, No. 7, 12-1977.

*Primary Examiner*—Gene Z. Rubinson
*Assistant Examiner*—M. Paschall
*Attorney, Agent, or Firm*—R. J. McCloskey; F. M. Sajovec, Jr.

[57] ABSTRACT

An improved radial flow parallel plate plasma etcher, whose more uniform etching rate of wafers is due to radially decreasing the spacing between the electrodes wherein the gap between the electrodes is greatest at the circumference and smallest at center of the electrodes.

6 Claims, 2 Drawing Figures

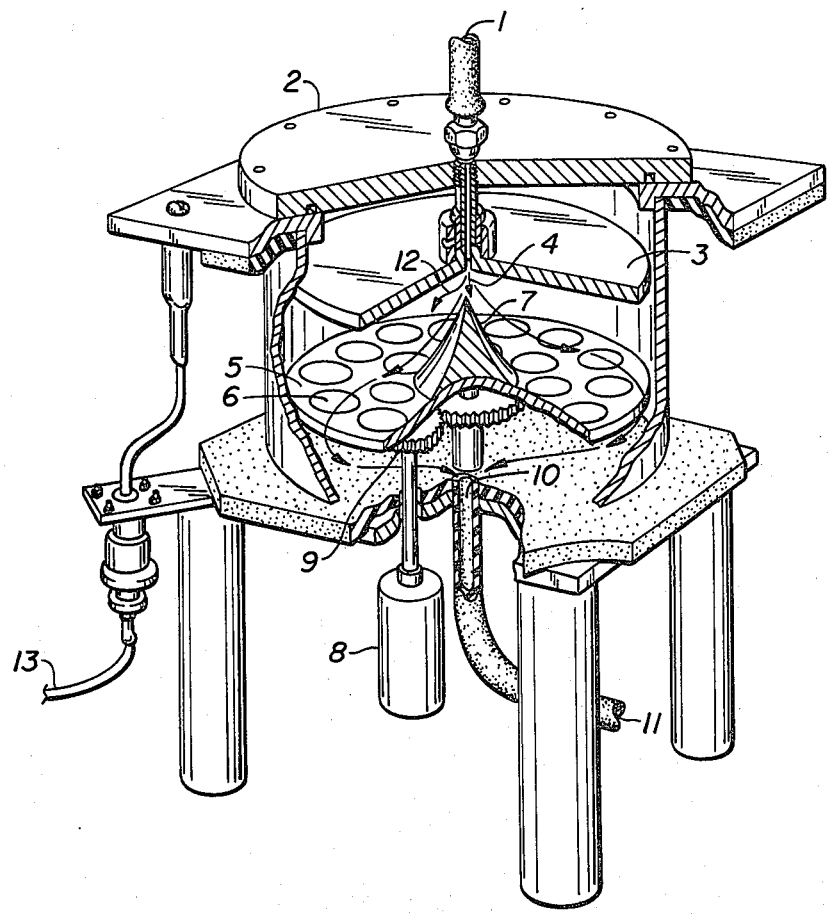
FIG._1.
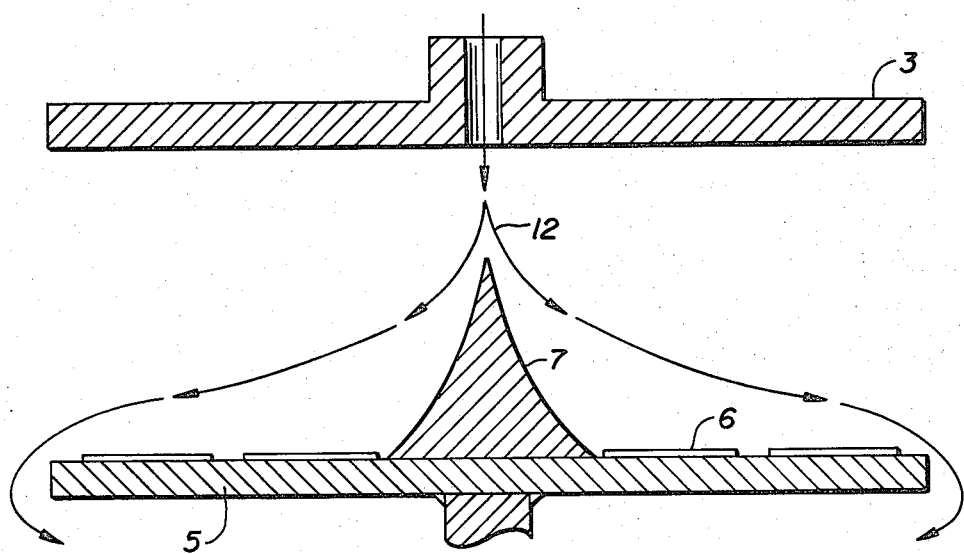
FIG._2.

PLASMA ETCHING APPARATUS II-CONICAL-SHAPED PROJECTION

BACKGROUND OF THE INVENTION

Gas plasma vapor etching has been utilized in the past for performing etching operations on semiconductor wafers by exposing the wafers to an active plasma to remove portions of materials carried by the semiconductor structure. The extension of the active plasma etching beyond the patterning of silicon, silicon nitride and silicon oxide has greatly expanded the horizons of plasma etchings to include, among other things, the etching of aluminum in the production of small geometry integrated circuits. Plasma as compared to chemical etching produces better edge definition, less undercutting, considerably less photoresist adhesion sensitivity, and the elimination of so-called "knee breakdown" due to thinning of the photoresist at sharp edges. This thinning where the aluminum goes over and down the side wall of a cut leads to premature resist failure during wet etching, thus permitting removal of the metal at the near edge.

One of the difficulties experienced in plasma etching has been the failure to achieve uniform etching of the wafer. This can be partially remedied by employing lower etching rates, which cause less effect on the resist, and by using greater spacing between wafers.

It has been further noted that beyond non-uniformity within each wafer, there remains a lack of etching uniformity from wafer to wafer wherein the etching rate decreases as the distance from the center of the circular electrode radially increases. This phenomenon was discussed in applicant's previous U.S. patent application, Ser. No. 928,594, filed July 27, 1978 which disclosed that uniform etching could be accomplished by radially decreasing the spacing between the electrodes wherein the gap between the electrodes is greatest at the center and smallest at the circumference of the electrode.

SUMMARY OF THE INVENTION

Applicant has now determined that a lack of uniformity is also evident when comparing wafer etching rates in other parts of the electrode. More specifically, although the physics is not entirely understood, wafers proximate to the geometric center of the electrode etch slower than wafers located at other locations.

It is thus an object of the present invention to increase the etch rate of wafers proximate the geometric center of the electrode.

It is another object of the present invention to carry out a plasma etching operation wherein all of the wafers are etched at a substantially constant rate, regardless of their placement within the plasma etching apparatus.

These and other objects of the present invention will be apparent from viewing the preferred embodiments and their accompanying drawings.

Improvements in uniformity are achieved by radially decreasing the spacing between the electrodes wherein the gap between the electrodes is smallest at the center and greatest at the circumference of the electrode. Accomplishment of the foregoing improvement is implemented by projecting a protrusion from the surface of the bottom electrode. By way of exemplification and not of limitation, the protrusion may take the shape of a cone, a frustrum of a cone, a cone having concave faces, a cone having convex faces and a semisphere.

Although here placement of the protrusion is on the bottom electrode, seating the protrusion upon the upper electrode is also a possible configuration. As recited in the previous paragraph, the protrusion may take many shapes besides that of a cone. Furthermore, the plasma etching apparatus embodying the present invention has been described having "upper" and "lower" electrodes, the improvements described herein can be incorporated in virtually any parallel plate plasma etcher.

BRIEF DESCRIPTION OF THE DRAWING

FIG. 1 is a perspective view of a plasma etching device.

FIG. 2 is a cross-sectional view of the electrode configuration according to the present invention.

DESCRIPTION OF THE PREFERRED EMBODIMENTS

As depicted in FIG. 1, a perspective view of a parallel type radial flow plasma etcher is shown wherein certain details which are of no importance in understanding the present invention have been eliminated. As depicted, a representative wafer 6, to be etched is shown residing on lower electrode 5 which is designed to rotate via variable speed drive motor 8 and drive pinion 9.

Gas which will form the plasma enters through orifice 1 in top plate 2 and feeds into the etching chamber between the electrodes at 4. The gas passes through top electrode 3 and circulates as shown by arrows 12 down the sides of projection 7. As previously stated, projection 7 is herein depicted as being conical merely for purposes of illustration, and is not meant to be restricted to this configuration. The gas then continues its path over representative wafer 6, then is collected through orifice 10 via vacuum connection 11.

Viewing FIGS. 1 and 2 together, traditional parallel plate radial flow plasma etchers possess two electrodes which sandwich the wafers. Unlike traditional designs, bottom electrode 5 has been modified to possess a protrusion 7 which results in a reduced gap at the center of the circular electrodes as compared to the gap found at their circumferences. This increases the current density at and near the center of the electrodes over what the current density would be with completely parallel electrodes.

The protrusion of the present invention is shown as a cone in the appended drawings. The ideal shape of the protrusion in a particular application depends upon the operating parameters of the plasma etcher. For example, gas flow rate and charge density may dictate the selection of a protrusion which is shaped as the frustrum of a cone or as a sphere or cone with convex or concave faces.

It is also recognized that placement of the protrusion need not be limited to the lower electrode. Placement of the protrusion upon the upper electrode is also a possibility. Further study may also show that multiple protrusions are advantageous and feasible.

What is claimed is:

1. In a radial flow plasma etcher including an upper circular electrode, a lower circular electrode spaced apart from the upper electrode and including means for receiving one or more wafers thereon, the improvement wherein said electrodes are formed to provide a gap between the electrodes which is greatest at the circumference and smallest at the center thereof, the face of one of said upper and lower electrodes being substantially planar and the face of the other of said upper and lower electrodes having an annular area proximate its circumference which is substantially planar and substantially parallel to the face of said one electrode.

2. The radial flow plasma etcher of claim 1 including means for introducing the gas forming the plasma from substantially the center of the upper electrode.

3. The radial flow plasma etcher of claim 1 wherein said lower electrode possesses a substantially cone-shaped member within said annular area.

4. The radial flow plasma etcher of claim 1 wherein said annular area is formed on the bottom electrode and said one or more wafers are received within said annular area.

5. A plasma etch apparatus comprising:
   a vacuum chamber,
   a first electrode having a substantially circular face positioned within said chamber and having a first surface defining one side of the plasma etching region,
   a second electrode having a substantially circular face positioned within said chamber and having a second surface defining the other side of the plasma etching region,
   said first and second surfaces facing one another to define the plasma etching region therebetween,
   said first and second surfaces shaped to provide a greater distance therebetween adjacent the periphery, as defined by an annular area upon the periphery of the second surface, than inwardly from adjacent their peripheries,
   means for establishing an electrical potential difference between said electrodes, and
   means for introducing gas into said vacuum chamber with the gas flowing between the portion of the plasma etching region adjacent the periphery of said first and second surfaces and the portion of the plasma etching region inwardly from the periphery of said surfaces to produce an etching plasma in the region between said first and second surfaces.

6. The plasma etch apparatus of claim 5 wherein the distance between the substantially circular faces of second and first electrodes increases in the direction radially outward from the center of the electrodes.

* * * * *